(12) United States Patent
Lee (10) Patent No.: US 8,369,125 B2
(45) Date of Patent: Feb. 5, 2013

(54) SEMICONDUCTOR INTEGRATED CIRCUIT DEVICE CAPABLE OF SECURING GATE PERFORMANCE AND CHANNEL LENGTH

(75) Inventor: Myoung Jin Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 125 days.

(21) Appl. No.: 13/087,838

(22) Filed: Apr. 15, 2011

(65) Prior Publication Data

US 2011/0255324 A1 Oct. 20, 2011

(30) Foreign Application Priority Data

Apr. 16, 2010 (KR) .......................... 10-2010-0035280
Apr. 14, 2011 (KR) .......................... 10-2011-0034635

(51) Int. Cl.
*G11C 5/06* (2006.01)
(52) U.S. Cl. ................. 365/63; 365/51; 365/72
(58) Field of Classification Search .............. 365/63, 365/51, 72, 174, 177
See application file for complete search history.

(56) References Cited

U.S. PATENT DOCUMENTS 7,889,532 B2 * 2/2011 Yang et al. ................ 365/63

FOREIGN PATENT DOCUMENTS

KR 10-0338275 B1 5/2002
KR 10-0855967 B1 8/2008

* cited by examiner

*Primary Examiner* — David Lam
(74) *Attorney, Agent, or Firm* — William Park & Associates Ltd.

(57) ABSTRACT

A semiconductor integrated circuit device includes a semiconductor substrate; a plurality of word lines extending parallel to one another on the semiconductor substrate; a plurality of bit lines extending parallel to one another on the semiconductor substrate, arranged to cross with the word lines, and delimiting a plurality of crossing regions where the word lines intersect the bit lines and a plurality of unit memory cell regions with each cell region bounded by an adjacent pair of the word lines and an adjacent pair of the bit lines; and gate electrodes for the respective unit memory cell regions, each gate electrode electrically connected with any one of a pair of word lines which delimit a corresponding unit memory cell, and formed such that at least a portion of the gate electrode is bent toward a bit line direction.

24 Claims, 13 Drawing Sheets

SEMICONDUCTOR INTEGRATED CIRCUIT DEVICE CAPABLE OF SECURING GATE PERFORMANCE AND CHANNEL LENGTH

CROSS-REFERENCES TO RELATED APPLICATION

The present application claims priority under 35 U.S.C. §119(a) to Korean application numbers 10-2010-0035280 and 10-2011-0034635, filed on Apr. 16, 2010 and Apr. 14, 2011, in the Korean Intellectual Property Office, which is incorporated herein by reference in its entirety.

BACKGROUND

1. Technical Field

The present invention relates to a semiconductor integrated circuit device, and more particularly, to a high density semiconductor integrated circuit device capable of securing gate performance and a channel length.

2. Related Art

As integration of semiconductor memory devices increase, an area occupied by each memory cell decreases. In correspondence to the decrease in the area of the memory cell, various optimization attempts have been made, such as forming connection members for connecting a switching element, a bit line, a word line, and a capacitor in a buried type mode.

One suggestion has been a vertical channel semiconductor device in which a source and a drain of a MOS transistor used as a switching element are vertically arranged with a vertical channel.

The vertical channel MOS transistor includes a pillar which is vertical with respect to a semiconductor substrate, a gate electrode which is formed around the pillar, and a source and a drain which are formed on upper and lower ends of the gate electrode.

Such a vertical channel MOS transistor has an advantage in that the area of the vertical channel MOS transistor does not increase even when a channel length is increased. The vertical channel MOS transistor may also make use of a buried bit line.

However, since the pillar of the vertical channel MOS transistor should be formed as described above and the gate electrode should be formed to surround the outer circumference of the pillar, manufacturing processes are substantially complicated. For example, in order to form the gate electrode using the pillar, a complicated etching process is needed, and it is difficult to secure the characteristics of a transistor due to the complicated process.

Moreover, because of the small margin of a process of burying a metal bit line in a predefined space of the semiconductor substrate, contact between the metal bit line with the drain formed on the pillar becomes poor.

However, in the case where such a vertical structure is not adopted, as integration of a memory device increases, adjoining gate electrodes are likely to be influenced by one another, and since it is difficult to sufficiently secure a channel length, a short channel effect may be caused.

SUMMARY

A semiconductor integrated circuit device capable of reducing an occupation area of a unit memory cell and securing performance of a transistor is described herein.

In one embodiment of the present invention, a semiconductor integrated circuit device includes: a semiconductor substrate; a plurality of word lines extending parallel to one another on the semiconductor substrate; a plurality of bit lines extending parallel to one another on the semiconductor substrate, arranged to cross with the word lines, and delimiting a plurality of crossing regions where the word lines intersect the bit lines and a plurality of unit memory cell regions with each cell region bounded by an adjacent pair of the word lines and an adjacent pair of the bit lines; and gate electrodes for the respective unit memory cell regions, each gate electrode electrically connected with any one of a pair of word lines which delimit a corresponding unit memory cell, and formed such that at least a portion of the gate electrode is bent toward a bit line direction.

In another embodiment of the present invention, a semiconductor integrated circuit device includes: a semiconductor substrate divided into active regions and an isolation layer; a plurality of word lines extending parallel to one another and formed on the isolation layer of the semiconductor substrate; a plurality of bit lines extending parallel to one another on the semiconductor substrate, arranged to cross with the word lines, and delimiting a plurality of crossing regions where the word lines intersect the bit lines and a plurality of unit memory cell regions with each cell region bounded by an adjacent pair of the word lines and an adjacent pair of the bit lines; gate electrodes for the respective unit memory cell regions, and each gate electrode including a first portion which is electrically connected with any one of a pair of word lines which delimit a corresponding unit memory cell and a second portion which extends from one end of the first portion to overlap with any one of a pair of bit lines which delimit the corresponding unit memory cell; a plurality of storage node contacts respectively disposed in the unit memory cell regions; and a plurality of bit line contacts connecting the bit lines and the active regions, wherein shared gate contact parts, corresponding to portions of the word lines which are commonly contacted by the word lines and pairs of gate electrodes, and the bit line contacts are alternately arranged in a diagonal direction of the plurality of word lines and the plurality of bit lines.

In another embodiment of the present invention, a semiconductor integrated circuit device includes: a semiconductor substrate including active regions; word lines arranged on the semiconductor substrate; bit lines arranged to cross with the word lines such that unit memory cells are each delimited by a pair of adjacent word lines and a pair of adjacent bit lines; gate electrodes contacting predetermined portions of the word lines and bent to overlap with the bit lines; and bit line contacts electrically connecting the bit lines and the active regions, wherein gate electrodes of unit memory cells, which adjoin each other with a word line interposed therebetween, are commonly connected with the corresponding word line, and wherein the bit line contacts are arranged on portions of the bit lines between an adjacent pair of the word lines.

BRIEF DESCRIPTION OF THE DRAWINGS

Features, aspects, and embodiments are described in conjunction with the attached drawings, in which.

DETAILED DESCRIPTION

In various embodiments of the present invention, in order to reduce the area of each unit memory cell, $4F^2$ memory cells will be disclosed. These memory cells are configured such that the memory cells share word lines with adjoining memory cells in a column direction, for example, a bit line direction, and share bit lines with adjoining memory cells in a row direction, for example, a word line direction.

Also, in various embodiments of the present invention, the shape of gate electrodes of the $4F^2$ memory cells is changed to alleviate the short channel effect in a highly integrated device.

In the memory cell structure according to various embodiments of the present invention, instead of realizing complicated three-dimensionally structured elements to form switching elements at crossing points of word lines and bit lines, bit line contacts are formed at positions separated by 1 F from the crossing points of the word lines and the bit lines.

Hereinafter, a semiconductor integrated circuit device capable of securing gate performance and a channel length according to the present invention will be described below with reference to the accompanying drawings through exemplary embodiments. It may be noted that the various embodiments described are for illustrative purposes and do not limit the invention to any way.

Figure 1:
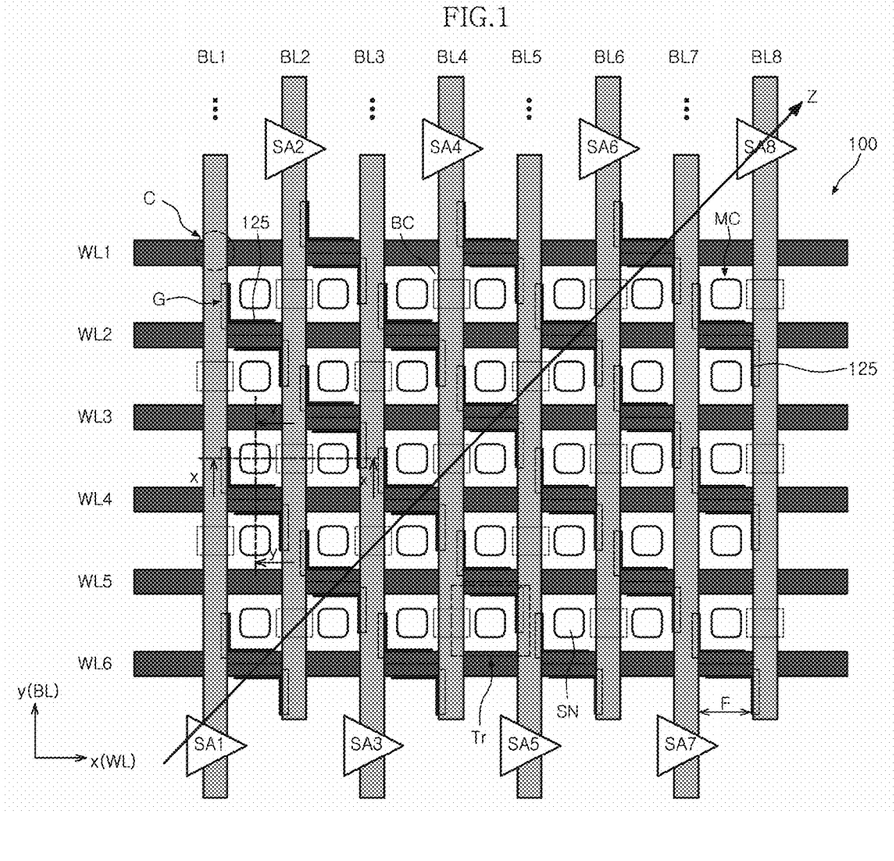
FIG. 1 is a plan view illustrating a cell array of a semiconductor memory device in accordance with an embodiment of the present invention.

Referring to FIG. 1, a semiconductor memory device 100 includes a plurality of word lines WL1 to WL6, a plurality of bit lines BL1 to BL8, switching transistors Tr, storage nodes SN, and bit line contacts BC. In the present embodiment, for the sake of convenience in explanation, a cell array of six word lines by eight bit lines will be described as an example. Further, the storage nodes SN may also be called storage node contact pads and the bit line contacts BC may be called bit line contact pads.

The plurality of word lines WL1 to WL6 is shown as extending along the x-axis. These word lines WL1 to WL6 may be arranged with substantially the same line width and spacing. The line width and spacing may define a minimum feature size F for manufacturing a semiconductor device. The word lines WL1 to WL6 are electrically connected with gate electrodes G which constitute the switching transistors Tr.

The plurality of bit lines BL1 to BL8 is shown as extending with a predetermined spacing on the semiconductor substrate in such a way as to intersect the word lines WL1 to WL6, or along the y-axis. The line width and spacing of the bit lines BL1 to BL8 may also define a minimum feature size F for manufacturing a semiconductor device.

Sense amplifiers SA1 to SA8 are connected to the respective bit lines BL1 to BL8. The sense amplifiers SA1 to SA8 amplify data received via the bit lines BL1 to BL8. In consideration of area utilization efficiency, odd sense amplifiers SA1, SA3, SA5 and SA7 may be connected to the lower ends of the bit lines BL1, BL3, BL5 and BL7, and even sense amplifiers SA2, SA4, SA6 and SA8 may be connected to the upper ends of the bit lines BL2, BL4, BL6 and BL8.

By forming a matrix with the plurality of word lines WL1 to WL6 and the plurality of bit lines BL1 to BL8, unit memory cell regions MC, or unit memory cells, are delimited in the semiconductor substrate. The reference symbol C designates a region where one of the word lines WL1 to WL6 intersects one of the bit lines BL1 to BL8.

The switching transistors Tr may comprise the gate electrodes G positioned under the word lines WL1 to WL6, source regions (not shown) formed in the semiconductor substrate corresponding to the memory cell regions MC, and drain regions (not shown) which correspond to the semiconductor substrate under the bit lines BL1 to BL8.

Figure 2:
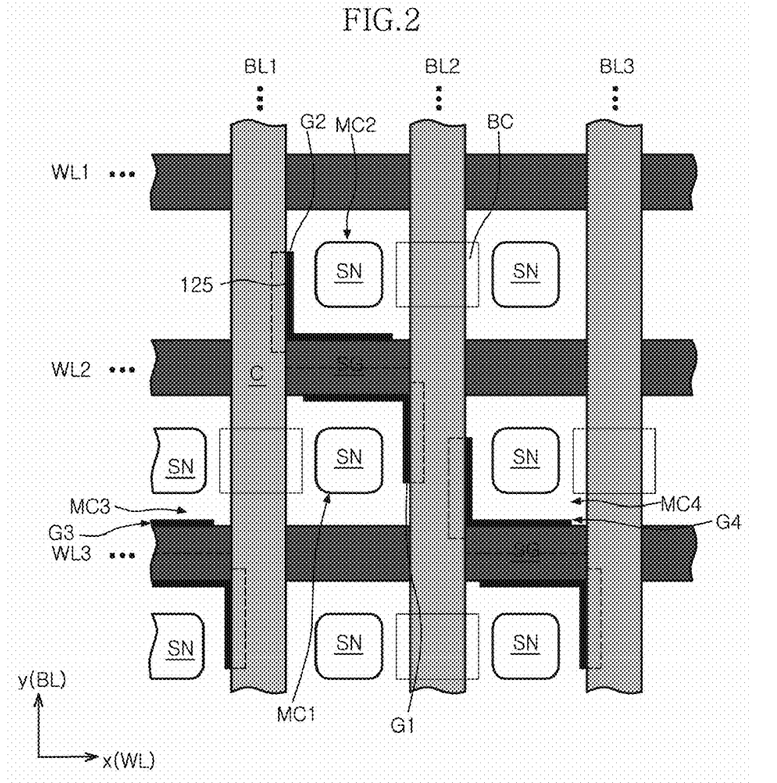
FIG. 2 is an enlarged plan view illustrating unit memory cells shown in FIG. 1.

As shown in FIG. 2, the gate electrodes G are respectively disposed in the unit memory cell regions MC. Each of gate electrodes G1, G2, G3 and G4 may be electrically connected with one word line of a pair of word lines adjacent to each of the unit memory cell regions MC1, MC2, MC3 and MC4.

Figure 3:
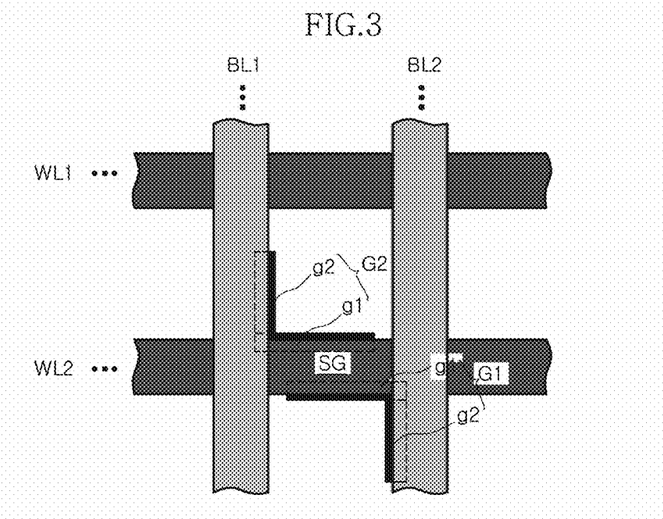
FIG. 3 is an enlarged plan view of the semiconductor memory device for explaining the shape and the layout of the gate electrodes shown in FIG. 1.

In detail, as shown in FIG. 3, the gate electrodes G1 and G2 may have the substantial shape of the letter "L". Each of the gate electrodes G1 and G2 may include a first portion g1 that contacts a word line, for example, WL2, and a second portion g2 that contacts a bit line, for example, BL2. Since a portion of the word line WL2 is commonly connected with the first portion g1 of the two gate electrodes G1 and G2, that portion of the word line WL2 may generally be referred to as a shared gate contact part SG.

Each gate electrode G is formed in the shape of "L" to substantially increase the surface area of the gate electrode to secure a channel length. Also, as the gate electrode extends toward the drain regions, a gate control range is increased so that gate performance is improved and influence from adjoining gate electrodes is diminished.

In the present embodiment, in order to ensure that the gate electrodes G1 and G2 of two adjoining unit memory cell regions MC1 and MC2 may share one word line, the gate electrodes G1 and G2 may be arranged with a rule as described below.

For example, when assuming that the gate electrode G1 of a selected unit memory cell region MC1 (hereinafter referred to as a "corresponding unit memory cell region") shares the word line WL2 with the gate electrode G2 of any one unit memory cell region MC2 adjoining thereto in a column direction (the y direction), for example, the extension direction of the bit lines BL, as shown in FIG. 2, the gate electrodes G1 and G2 of the corresponding unit memory cell region MC1 and the unit memory cell region MC2 adjoining thereto in the column direction may be disposed to respectively contact the corresponding word line WL2. In the present embodiment, the pair of gate electrodes G1 and G2 which share the word line WL2 are arranged in a state in which they are rotated by 180° with respect to the counterpart gate electrodes G2 and G1.

The gate electrode G1 of the corresponding unit memory cell MC1 may not share the same word line WL2 with the gate electrodes G3 and G4 of the unit memory cells MC3 and MC4 adjoining thereto in a row direction (the x direction), for example, the extension direction of the word lines WL. Accordingly, the gate electrodes G3 and G4 of the unit memory cells MC3 and MC4 adjoining the corresponding unit memory cell MC1 in the word line extension direction (the x direction) are disposed to contact the word line WL3 (or WL1) positioned in the next row (or the preceding row) of the corresponding word line WL2.

That is to say, the shared gate contact part SG arranged on an odd word line is positioned between a pair of shared gate contact parts SG arranged on adjoining even word lines.

Accordingly, when viewing the unit memory cells positioned in the same column, the shared gate contact parts SG are arranged on every other word line WL.

When viewing the entire cell array, the shared gate contact parts SG are arranged along a diagonal line Z with respect to directions in which the word lines WL1 to WL6 and the bit lines BL1 to BL8 are arranged (see FIG. 1).

The storage nodes SN are formed to be electrically connected with the source regions of the matrix spaces, that is, the switching transistors Tr. The storage nodes SN are nodes which contact the bottom electrodes of capacitors serving as storage media, and substantially occupy most of the unit memory cell regions MC.

The bit line contacts BC are contact plugs which electrically connect the bit lines BL and the drain regions (not shown). In the present embodiment, the bit line contacts BC may be positioned under predetermined portions of pure bit line regions L excluding the crossing regions C where the bit lines overlap the word lines. Similarly to the gate electrodes G, the bit line contacts BC are arranged with a rule, which will be described below in detail.

Figure 4:
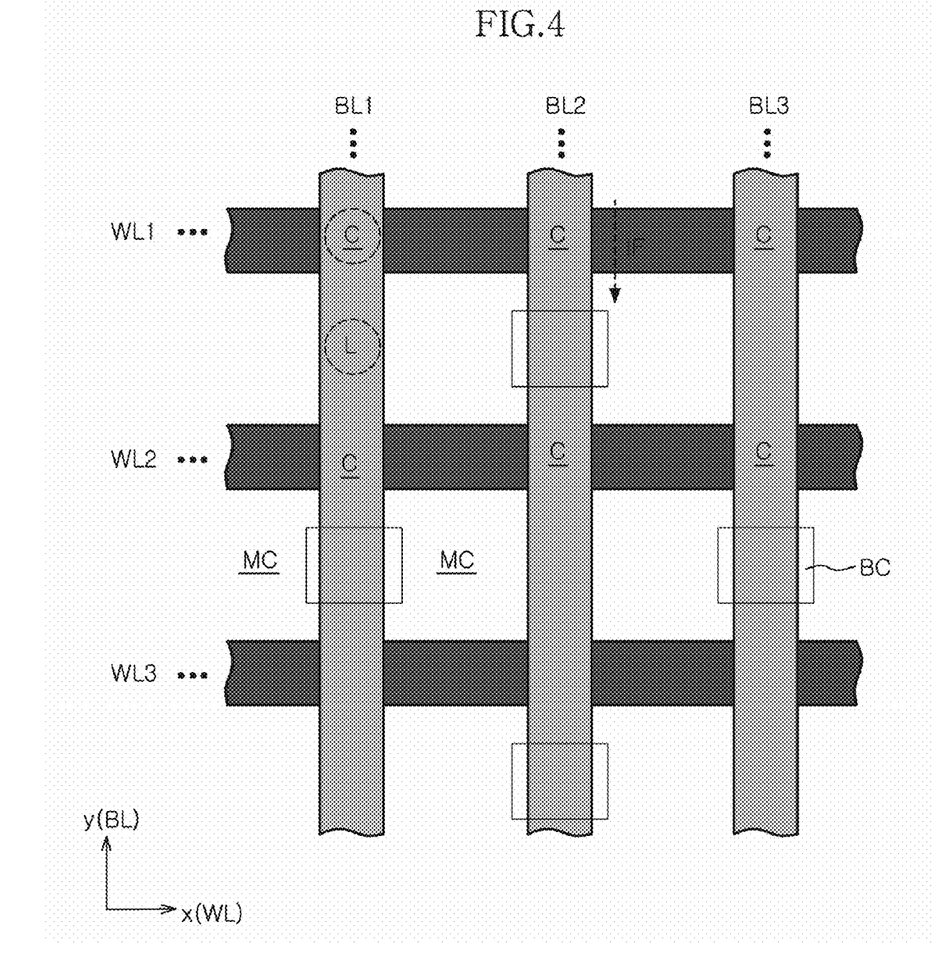
FIG. 4 is an enlarged plan view of the semiconductor memory device for explaining the shape and the layout of the bit line contacts shown in FIG. 1.

Referring to FIG. 4, the bit lines BL1 to BL3 are configured in the cell array in such a manner that the pure bit line regions L and the crossing regions C are alternately repeated. While it is the norm in the case of a conventional unit memory cell that a bit line contact is disposed in a crossing region, in the present embodiment, the bit line contacts BC, which are disposed in the pure bit line regions L, are shifted from the crossing regions C by 1 F.

Further, in the present embodiment, when viewing each of the bit lines BL1, BL2 and BL3, the bit line contacts BC are disposed in every other pure bit line regions L. In other words, when viewing the bit line BL2, if a bit line contact BC is disposed in a first pure bit line region L between the word lines WL1 and WL2, a next bit line contact BC is disposed in a third pure bit line region L between the word lines WL3 and WL4 (not shown).

Moreover, any one bit line contact BC may not be disposed between the same word lines as bit line contacts BC disposed under adjoining bit lines BL. For example, the bit line contacts BC of the odd bit lines BL1 and BL3 are positioned between the word lines WL2 and WL3 while a pair of adjoining bit line contacts BC of the even bit line BL2 are positioned between the word lines WL1 and WL2 and the word lines WL2 and WL3. In this way, pairs of unit memory cells MC which adjoin each other in the word line direction may share one bit line BL.

When viewing the bit line contacts BC according to the present embodiment in the light of the entire cell array, as shown in FIG. 1, the bit line contacts BC are placed between adjoining shared gate contact parts SG which are arranged in the diagonal direction. Therefore, the bit line contacts BC and the shared gate contact parts SG are alternately repeated in the diagonal direction.

Figure 5:
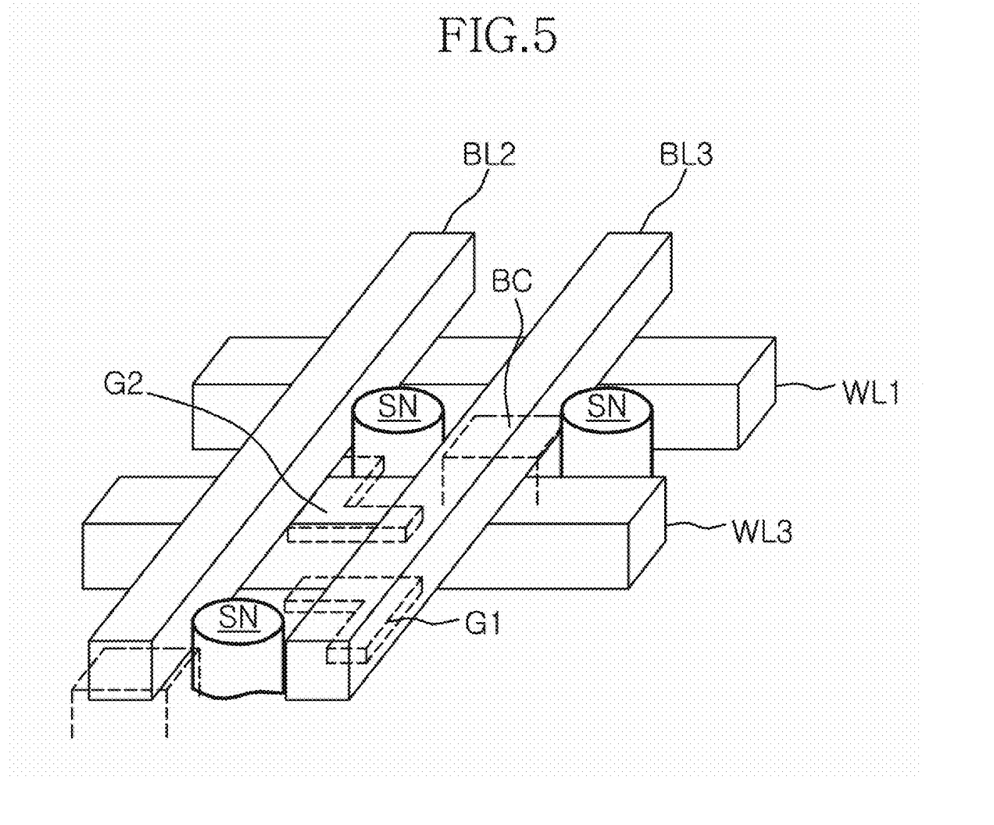
FIG. 5 is a perspective view of a unit memory cell of the semiconductor memory device in accordance with the embodiment of the present invention.

Referring to FIG. 5, as each of the unit memory cells shares a length corresponding to 2 F in each of the word line direction and the bit line direction, the semiconductor integrated circuit device may have a total area of 4 $F^2$. Also, as the gate electrodes G1 and G2 are formed to overlap with the word lines WL and the bit lines BL, the performance of the gate electrodes may be improved and a channel length may be secured.

The cross-sectional structures of the semiconductor memory device in the x direction and the y direction will be described below in detail.

Figure 6:
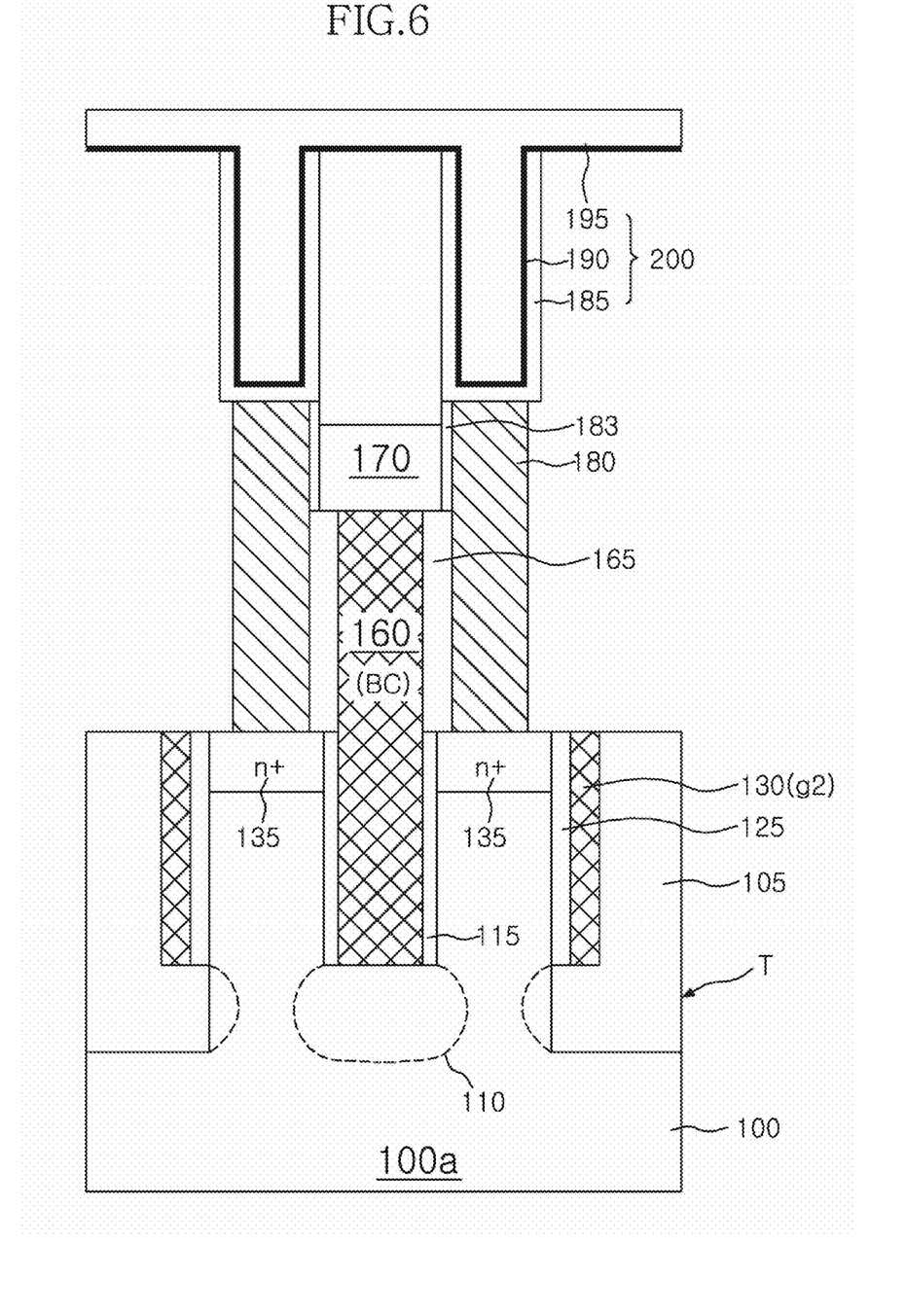
FIG. 6 is a cross-sectional view taken along the line x-x' of FIG. 1.

FIG. 6 is a cross-sectional view taken along the line x-x' of FIG. 1 and shows two unit memory cells which adjoin each other in the word line extension (x-axis) direction.

As can be seen in the cross-sectional structure of the semiconductor memory device in the word line extension direction with reference to FIG. 6, a plurality of active regions 100a are delimited in a semiconductor substrate 100 by an isolation layer 105.

A drain region 110 is formed at the center of the active region 100a in which two unit memory cells are to be formed. The drain region 110 may be formed in the active region 100a, and a bit line contact 160 (BC of FIG. 1) is formed on the drain region 110 to be electrically connected with the drain region 110. The bit line contact 160 has a shape which protrudes out of the semiconductor substrate 100 starting from the inside of the active region 100a. Dielectric spacers 115 are interposed between the sidewalls of the bit line contact 160 and the active region 100a, and a bit line 170 is formed on the bit line contact 160.

Gate electrodes 130 and a gate dielectric layer 125 are interposed between the active region 100a o and the isolation layer 105, on both sides of the bit line contact 160. The gate electrode 130 may be a portion which corresponds to the second portion g2 of the gate electrode G in FIGS. 1 and 2 and partially overlaps with a bit line to be formed subsequently.

The gate electrodes 130 may be formed through the step of defining predetermined trenches (not shown) in the isolation layer 105, the step of forming the gate dielectric layer 125 by oxidating the sidewalls of the trenches, and the step of filling a conductive substance in the trenches. In the step of defining the trenches, an etching gas may be diffused not only in a direction parallel to the word lines but also in a direction parallel to the bit lines through directional etching of a plasma gas generally known in the art. As a consequence, it is possible to obtain a shape of trenches which is bent toward the bit lines, and due to this fact, it is possible to obtain the gate electrodes 130 in the shape of "L".

By implanting impurities into the active region 100a between the gate electrodes 130 and the bit line contact 160, source regions 135 are formed. The source regions 135 are electrically isolated from the gate electrodes 130 and the bit line contact 160 by the gate dielectric layer 125 and the dielectric spacers 115.

Storage node contacts 180 are formed on the source regions 135 according to a contact forming method generally known in the art. Storage capacitors 200, each constituted by a bottom electrode 185, a dielectric layer 190 and a top electrode 195, are formed on the storage node contacts 180. The capacitors 200 may be disposed over the bit line 170.

In order to ensure electrical isolation between the storage node contacts 180 and the bit line contact 160 and between the storage node contacts 180 and the bit line 170, dielectric spacers 165 and 183 are formed between the storage node contacts 180 and the bit line contact 160 and between the storage node contacts 180 and the bit line 170. For the sake of convenience in explanation, an interlayer dielectric layer is omitted in the drawing.

Figure 7:
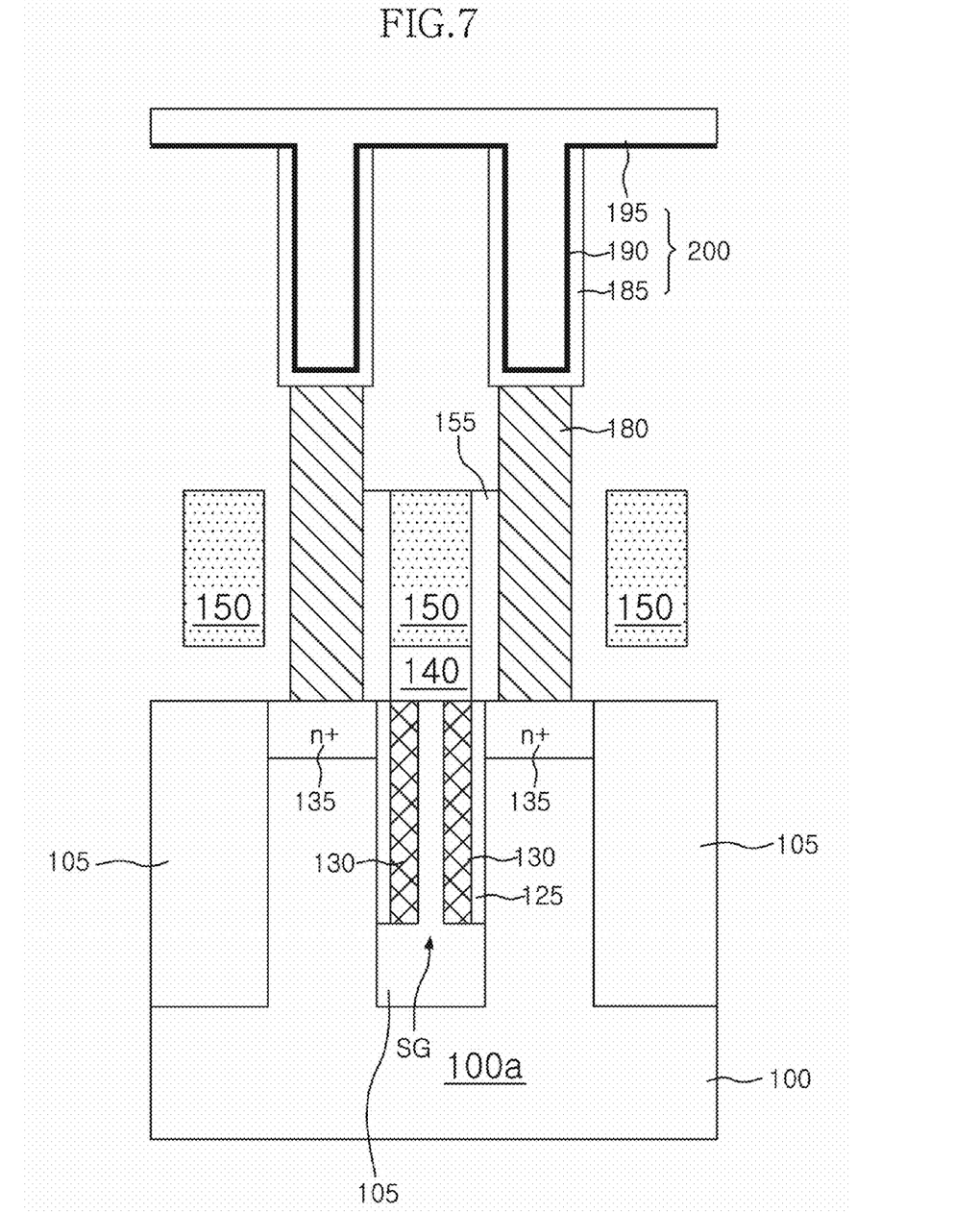
FIGS. 7 and 8 are cross-sectional views taken along the line y-y' of FIG. 1.
Figure 8:
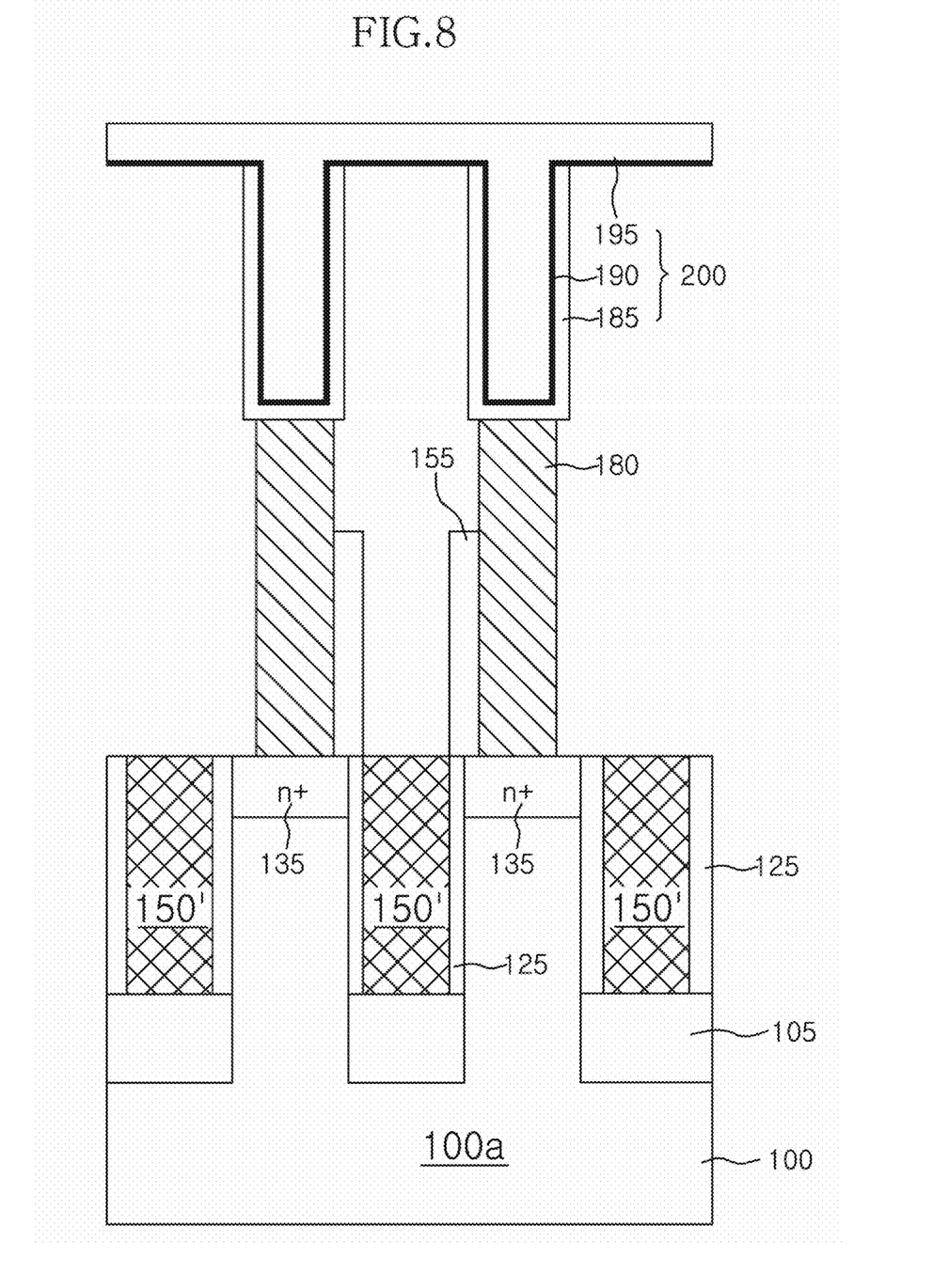

FIGS. 7 and 8 are cross-sectional views taken along the line y-y' of FIG. 1 and show two unit memory cells which adjoin each other in the bit line extension (y-axis) direction.

Referring to FIG. 7, in order to delimit the source regions 135 which will be contacted by the two storage node contacts 180, three portions of the isolation layer 105 are formed in the semiconductor substrate 100. Although the isolation layer 105 is shown by being divided into three portions because the isolation layer 105 is shown in a cross-section, the three portions of the isolation layer 105 may be integrated with one another.

The gate electrodes 130 are formed in the portion of the isolation layer 105 which is positioned between the source regions 135, and the gate dielectric layer 125 is formed between the gate electrodes 130 and the active region 100a.

As described above, the gate electrodes 130 may be formed through the step of defining predetermined trenches (not shown) in the isolation layer 105, the step of forming the gate dielectric layer 125 by oxidating the sidewalls of the trenches, and the step of filling a conductive substance in the trenches. Etching of the trenches may be conducted using well-known plasma etching capable of imparting directionality to an etching gas.

Because the gate electrodes 130 are formed on every other rows as mentioned above, in the case where the gate electrodes 130 are formed in the portion of the isolation layer 105 which is positioned midway, the gate electrodes 130 are not formed in the adjoining portions of the isolation layer 105. The gate electrodes 130 shown in the drawing correspond to the first portions g1 of the gate electrodes G1, G2, G3 and G4 shown in FIG. 2. Namely, the first portions g1 of the gate electrodes G1 and G2 which share one word line WL are formed in one portion of the isolation layer 105, and the corresponding portion of the word line WL serves as the shared gate contact part SG.

The source regions 135 are formed on both sides of the gate electrodes 130 by implanting impurities. As described above, the storage node contacts 180 are formed on the source regions 135 according to a method generally known in the art, and the capacitors 200 are formed on the storage node contacts 180.

Word lines 150 are formed over the isolation layer 105 on both sides of the storage node contacts 180. The word lines 150 may be formed by depositing and etching a conductive layer. A contact layer 140 may be disposed over the isolation layer 105 formed with the shared gate contact part SG of the gate electrodes 130 in such a way as to connect the gate electrodes 130 with the word line 150. Also, dielectric spacers 155 may be formed to electrically isolate the storage node contacts 180 and the word lines 150 from each other.

Figure 9:
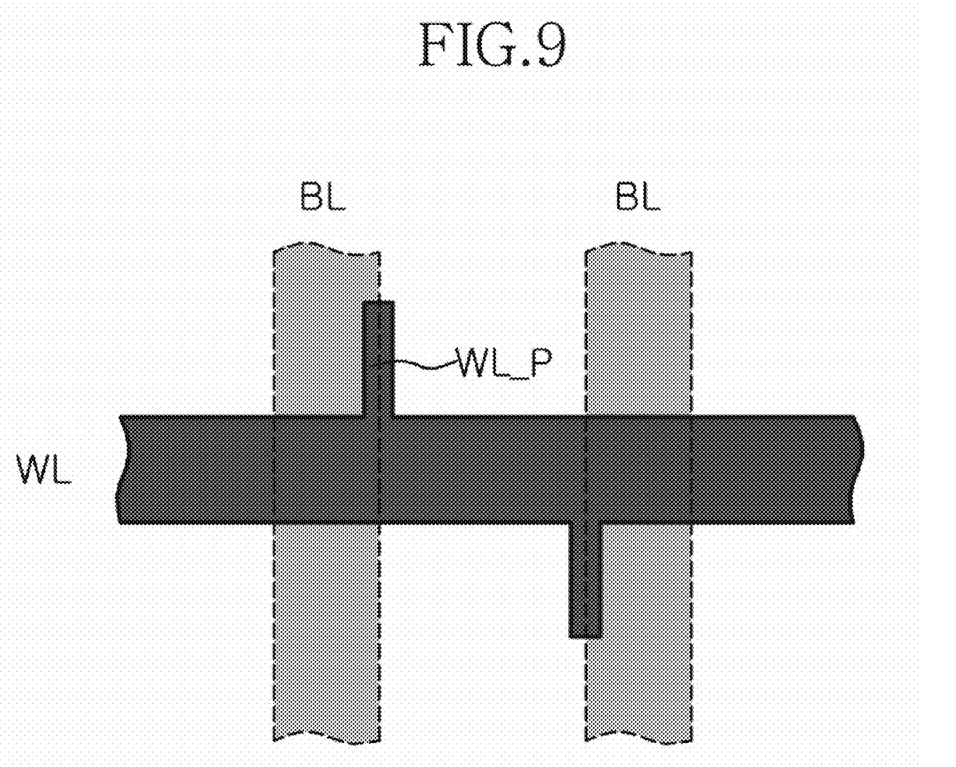
FIG. 9 is a plan view schematically illustrating the layout of word lines in accordance with another embodiment of the present invention.

Meanwhile, as shown in FIG. 8, in order to reduce coupling and signal interference between the storage node contacts 180 and word lines 150', the word lines 150' may be formed in the isolation layer 105 integrally with the gate electrodes 130. As shown in FIG. 9, the word lines 150' are formed in a shape which is buried in the semiconductor substrate 100. Predetermined branch portions WL_P may protrude from the shared gate contact part SG in directions of bit lines BL which constitute memory cells. The branch portions WL_P serve as the second portions g2 of the gate electrodes 130.

Since the word lines 150' may be formed simultaneously when performing a process for forming the gate electrodes 130, coupling and signal interference may be reduced without requiring additional process.

Figure 10:
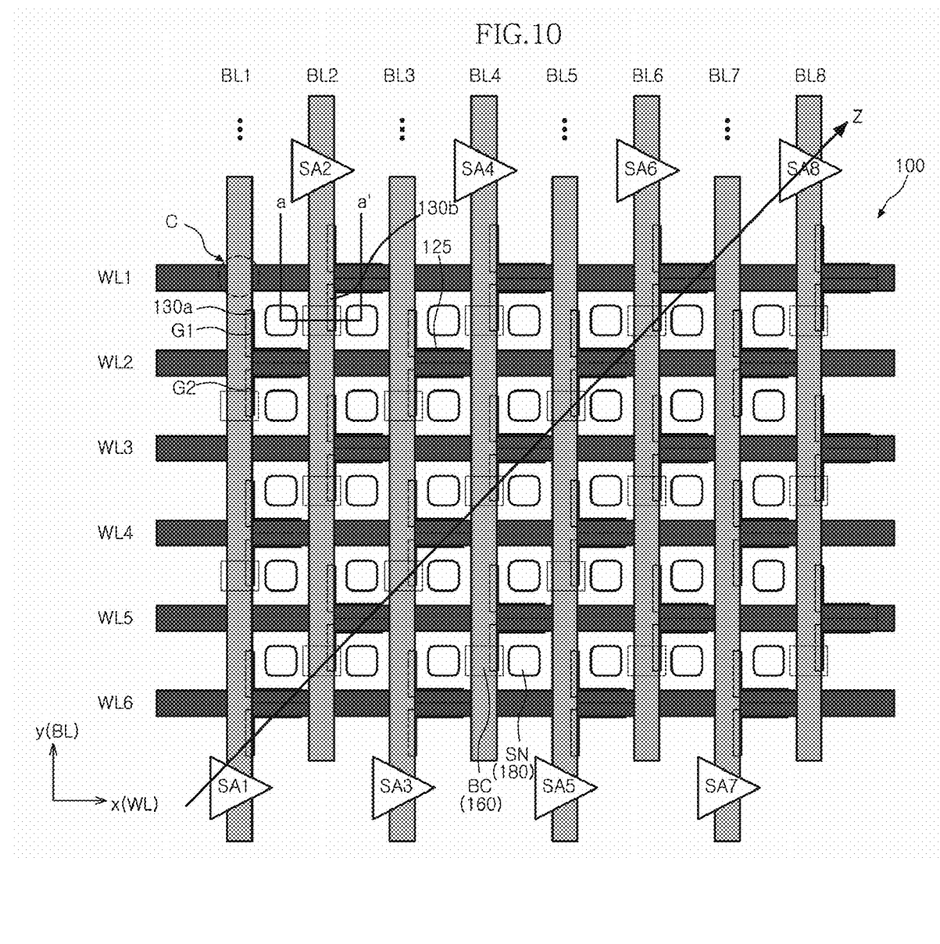
FIG. 10 is a plan view illustrating a cell array of a semiconductor memory device in accordance with another embodiment of the present invention.

While it was described in the aforementioned embodiment that the gate electrodes G1 and G2 which share one word line WL are arranged in a state in which they are rotated by 180° with respect to the counterpart gate electrodes G2 and G1, it is conceivable that, as shown in FIG. 10, the gate electrodes G1 and G2 may be arranged in symmetrical patterns with respect to the corresponding word line WL.

In this case, since a cross-sectional structure taken in the direction parallel to the bit line extension (y-axis) direction is the same as shown in FIG. 7 or 8, repeated descriptions will be omitted. A cross-sectional structure taken in the word line extension (x-axis) direction, that is, taken along the line a-a' of FIG. 10 will be described below with reference to FIG. 11.

Figure 11:
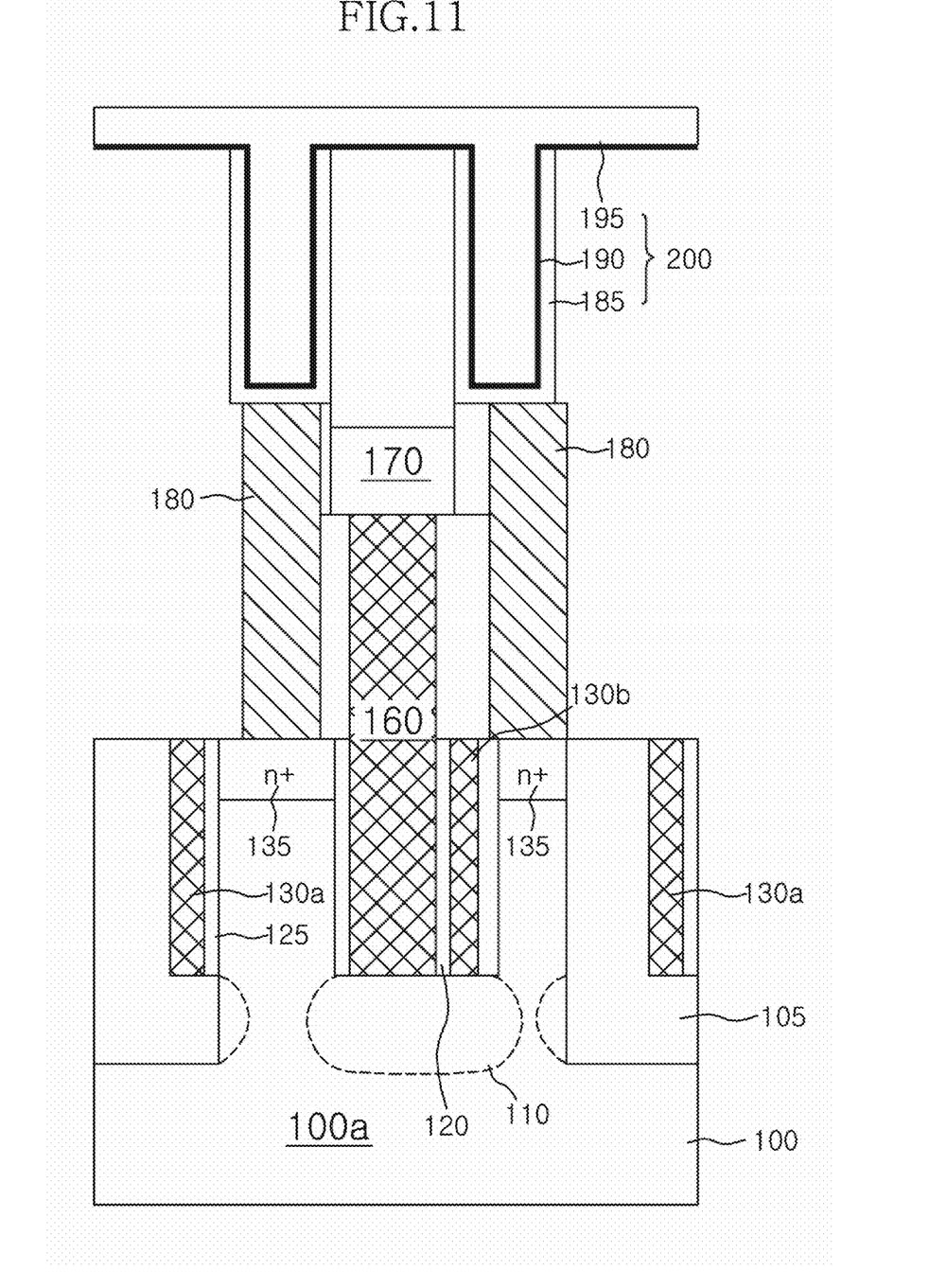
FIG. 11 is a cross-sectional view taken along the line a-a' of FIG. 10.

In the case where gate electrodes G1 and G2 which share one word line WL are symmetric to each other with respect to the corresponding word line WL, the gate electrodes G1 and G2, and in particular, the second portions g2 of the gate electrodes G1 and G2 may be respectively formed on one sidewall of the isolation layer 105 and one sidewall of the bit line contact 160. The reference numeral 130a designates the gate electrode which is formed on the sidewall of the isolation layer 105 and the reference numeral 130b designates the gate electrode which is formed on the sidewall of the bit line contact 160. A gate dielectric layer 125 is formed between the gate electrodes 130a and 130b and the active region 100a, and dielectric spacers 120 are formed between the gate electrode 130b and the bit line contact 160 to electrically isolate them from each other.

Figure 12:
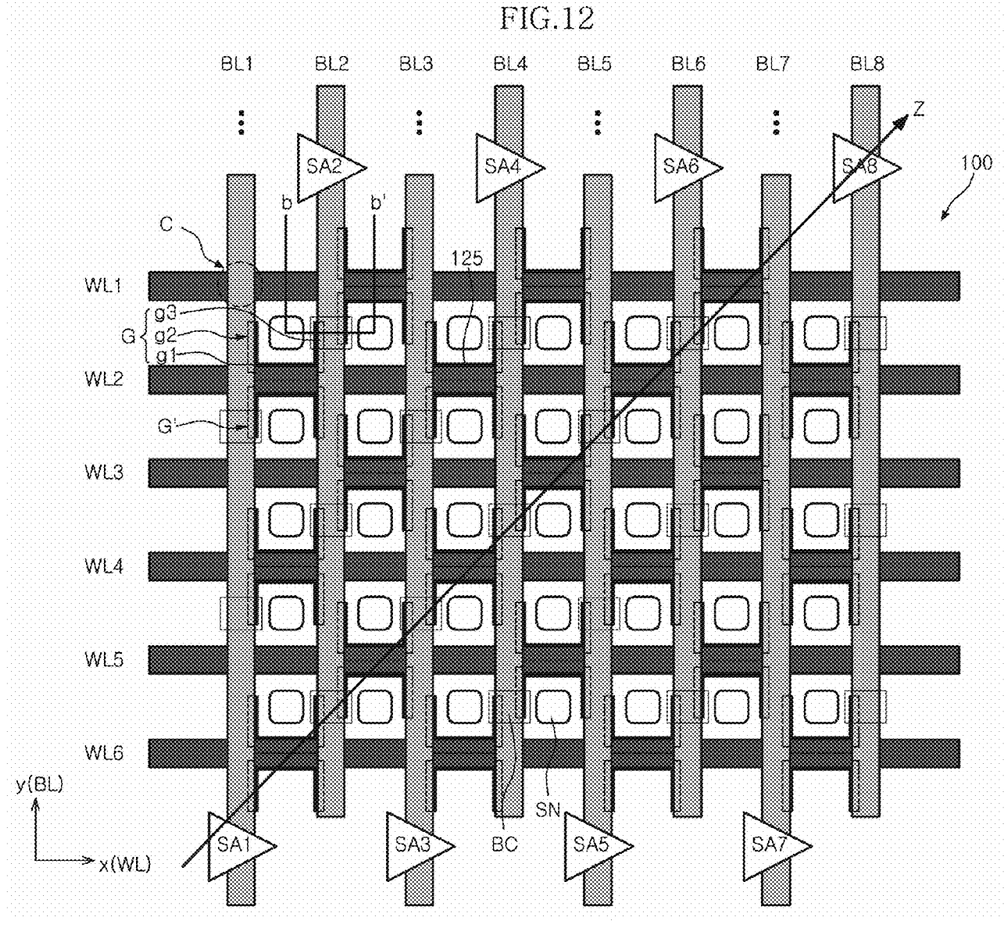
FIG. 12 is a plan view illustrating a cell array of a semiconductor memory device in accordance with another embodiment of the present invention.
Figure 13:
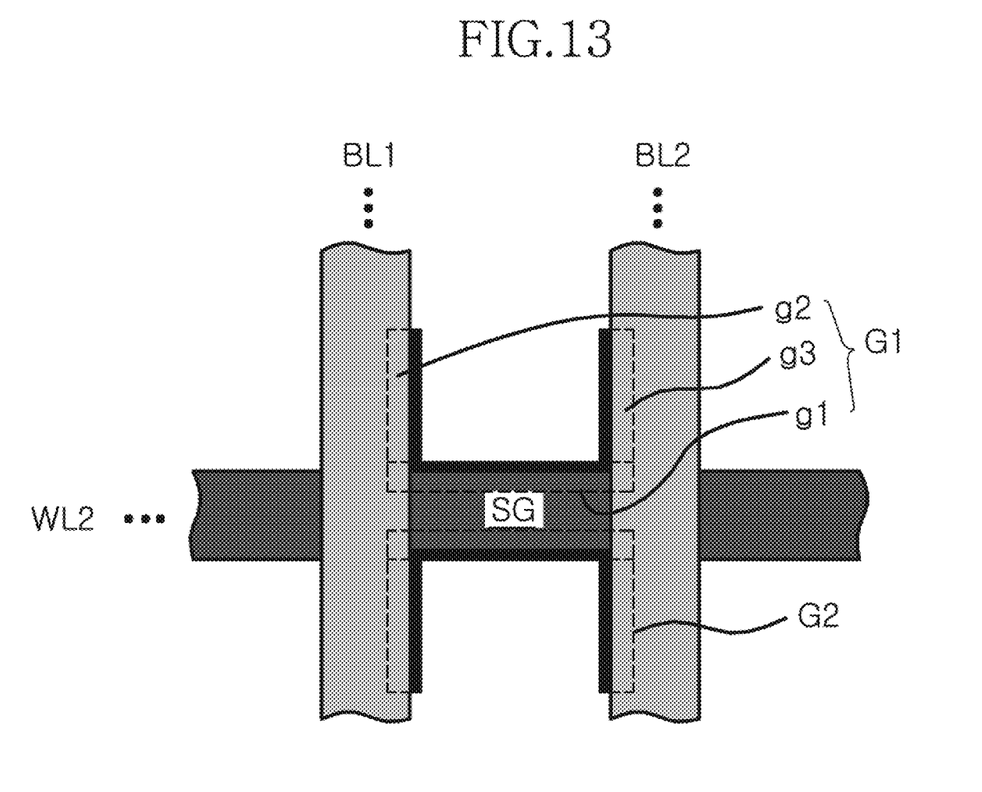
FIG. 13 is an enlarged plan view illustrating a gate electrode structure in accordance with another embodiment of the present invention.

Referring to FIG. 12, gate electrodes G may be formed in the shape of the letter "U". Describing in detail, as shown in FIG. 13, each of gate electrodes G1 and G2 has a first portion g1 which overlaps with and contacts a corresponding word line, for example, WL2, and second and third portions g2 and g3 which respectively extend from both ends of the first portion g1 and overlap with a pair of adjoining bit lines, for example, BL1 and BL2. Such gate electrodes G provide an advantage in that a longer channel length can be secured when compared to the case of the gate electrodes formed in the shape of the letter "L".

The gate electrodes G1 and G2 which share the same word line are arranged to be symmetric to each other with respect to the corresponding word line.

Even in this case, since a cross-sectional structure taken in the direction parallel to the bit line extension (y-axis) direction is the same as shown in FIG. 7 or 8, repeated descriptions will be omitted. However, a cross-sectional structure taken in the direction parallel to the word line extension (x-axis) direction is changed.

Figure 14:
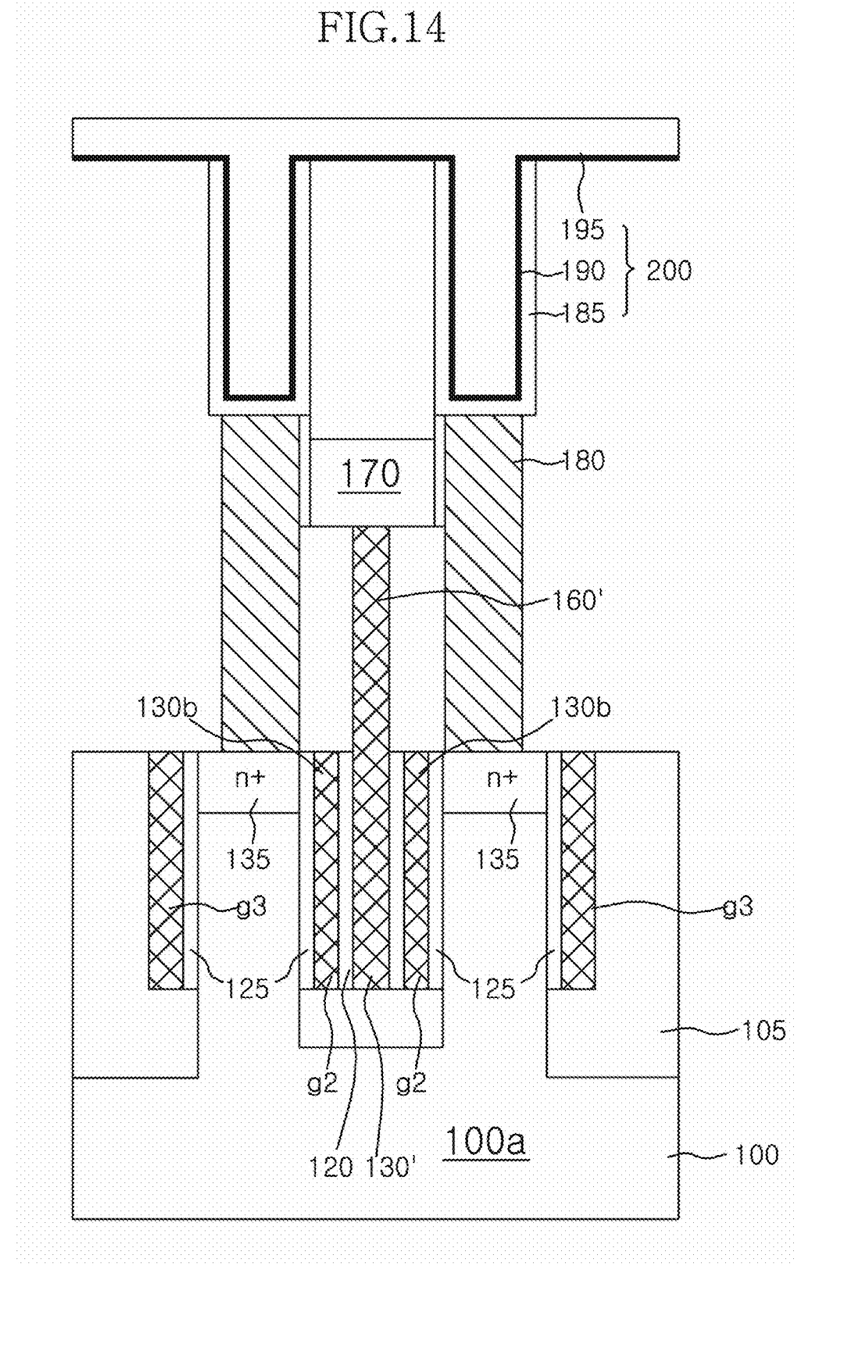
FIG. 14 is a cross-sectional view taken along the line b-b' of FIG. 12.

In this regard, FIG. 14 illustrates the case where gate electrodes G1 and G2, which share one word line WL, are formed to overlap with both of adjoining bit lines BL. Since the second portions g2 of the gate electrodes G1 and G2 are respectively positioned in the isolation layer 105 on both sides of a bit line contact 160', the third portions g3 may be formed on the sidewalls of the isolation layer 105 under the bit line 170 which face each other with source regions 135 interposed therebetween. A gate dielectric layer 125 is formed between the second and third portions g2 and g3 of the gate electrodes and the active region 100a, and the dielectric spacers 120 may be interposed between the second portions g2 of the gate electrodes G1 and G2 and the bit line contact 160'.

In the case where the gate electrodes 130' are formed in the shape of the letter "U", since the gate electrodes 130' extend to the isolation layer 105 in which the bit line contact 160' is formed, the line width of the bit line contact 160' may be narrowed when compared to the aforementioned embodiments.

Besides, when forming the gate electrodes G1 and G2 in the shape of the letter "U", in a processing for defining trenches in which the gate electrodes are to be formed, directionality is imparted to a trench etching gas so that trenches are defined toward bit line forming regions. Therefore, it is not necessary to perform a separate process.

In the aforementioned embodiments, interposition and deposition of some dielectric layers were omitted for the sake of convenience in explanation. However, deposition of a dielectric layer for preventing respective electrodes from being short-circuited is obvious in the art. Therefore, it is to be noted that the steps of forming dielectric layers are partially omitted in the embodiments of the present invention.

As is apparent from the above description, in the embodiments of the present invention, in an effort to secure gate performance and a channel length, each gate electrode is formed to overlap with or be integrated with a word line, and a portion thereof extends in such a way as to overlap with at least one of a pair of bit lines which delimit a unit memory cell.

Accordingly, gate performance and a channel length may be secured without using a separate mask and changing a design while having a unit memory cell area of 4 $F^2$.

While certain embodiments have been described above, it will be understood to those skilled in the art that the embodiments described are by way of example only. Accordingly, the semiconductor integrated circuit device capable of securing gate performance and a channel length described herein should not be limited based on the described embodiments. Rather, the semiconductor integrated circuit device capable of securing gate performance and a channel length described herein should only be limited in light of the claims that follow when taken in conjunction with the above description and accompanying drawings.

What is claimed is:

1. A semiconductor integrated circuit device comprising:
   a semiconductor substrate;
   a plurality of word lines extending parallel to one another on the semiconductor substrate;
   a plurality of bit lines extending parallel to one another on the semiconductor substrate, arranged to cross with the word lines, and delimiting a plurality of crossing regions where the word lines intersect the bit lines and a plurality of unit memory cell regions with each cell region bounded by an adjacent pair of the word lines and an adjacent pair of the bit lines; and
   gate electrodes for the respective unit memory cell regions, each gate electrode electrically connected with any one of a pair of word lines which delimit a corresponding unit memory cell, and formed such that at least a portion of the gate electrode is bent toward a bit line direction.

2. The semiconductor integrated circuit device according to claim 1, wherein each of the gate electrodes is formed in a shape which is buried in the semiconductor substrate.

3. The semiconductor integrated circuit device according to claim 1, further comprising:
   a plurality of storage node contacts respectively disposed in the unit memory cell regions.

4. The semiconductor integrated circuit device according to claim 1, wherein gate electrodes of unit memory cells, where the memory cells adjoin each other in the bit line direction with a word line interposed therebetween, are brought into contact with the word line in such a way as to share the word line.

5. The semiconductor integrated circuit device according to claim 4, wherein shared gate contact parts, where adjoining gate electrodes are brought into contact with corresponding word lines, are disposed in such a manner that a shared gate contact part positioned on an odd word line is arranged between a pair of adjoining shared gate contact parts positioned on even word lines.

6. The semiconductor integrated circuit device according to claim 5, further comprising:
   bit line contact formed to contact a predetermined portion of the bit line on one side of the crossing region.

7. The semiconductor integrated circuit device according to claim 6, wherein the bit line contacts are disposed in such a manner that a bit line contact positioned on an odd bit line is arranged between a pair of adjoining bit line contacts positioned on even bit lines.

8. The semiconductor integrated circuit device according to claim 6, wherein the shared gate contact parts, each of which is contacted by a pair of gate electrodes, are arranged in a diagonal direction of the plurality of word lines and the plurality of bit lines.

9. The semiconductor integrated circuit device according to claim 1, wherein gate electrodes of unit memory cells adjacent to each other with a word line interposed therebetween are configured to share the corresponding word line, and bit line contacts of unit memory cells adjacent to each other with a bit line interposed therebetween are configured to share the corresponding bit line.

10. The semiconductor integrated circuit device according to claim 1, wherein a pair of gate electrodes which share one word line are arranged in a state in which they are rotated substantially by 180° with respect to each other.

11. The semiconductor integrated circuit device according to claim 1, wherein gate electrodes which share one word line are symmetrical to each other with respect to the corresponding word line.

12. The semiconductor integrated circuit device according to claim 1, wherein the portions of the gate electrodes which are bent toward the bit lines are formed to overlap with sidewalls of the bit line contacts with a dielectric layer interposed therebetween.

13. The semiconductor integrated circuit device according to claim 1, wherein the word lines are formed to be buried in the semiconductor substrate.

14. The semiconductor integrated circuit device according to claim 13,
   wherein the semiconductor substrate includes active regions in which the unit memory cells are formed and an isolation layer which surrounds at least portions of the active regions, and
   wherein the word lines are formed in the isolation layer.

15. A semiconductor integrated circuit device comprising:
   a semiconductor substrate divided into active regions and an isolation layer;
   a plurality of word lines extending parallel to one another and formed on the isolation layer of the semiconductor substrate;
   a plurality of bit lines extending parallel to one another on the semiconductor substrate, arranged to cross with the word lines, and delimiting a plurality of crossing regions where the word lines intersect the bit lines and a plurality of unit memory cell regions with each cell region bounded by an adjacent pair of the word lines and an adjacent pair of the bit lines;

gate electrodes for the respective unit memory cell regions, and each gate electrode including a first portion which is electrically connected with any one of a pair of word lines which delimit a corresponding unit memory cell and a second portion which extends from one end of the first portion to overlap with any one of a pair of bit lines which delimit the corresponding unit memory cell;

a plurality of storage node contacts respectively disposed in the unit memory cell regions; and a plurality of bit line contacts connecting the bit lines and the active regions, wherein shared gate contact parts, corresponding to portions of the word lines which are commonly contacted by the word lines and pairs of gate electrodes, and the bit line contacts are alternately arranged in a diagonal direction of the plurality of word lines and the plurality of bit lines.

16. The semiconductor integrated circuit device according to claim 15, wherein the shared gate contact parts are positioned on every other word line or on every other bit line when viewed on the same row or the same column.

17. The semiconductor integrated circuit device according to claim 15, wherein the bit line contacts are positioned on every other word line or on every other bit line when viewed on the same row or the same column.

18. The semiconductor integrated circuit device according to claim 15, wherein a pair of gate electrodes, which are positioned on each shared gate contact part, are arranged in a state in which they are rotated substantially by 180° with respect to each other.

19. The semiconductor integrated circuit device according to claim 15, wherein a pair of gate electrodes, which are positioned on each shared gate contact part, are symmetrical to each other with respect to a corresponding word line.

20. The semiconductor integrated circuit device according to claim 15, wherein the word lines are positioned in the isolation layer.

21. The semiconductor integrated circuit device according to claim 20, wherein the gate electrodes are formed integrally with the word lines.

22. The semiconductor integrated circuit device according to claim 15, wherein each of the gate electrodes further includes a third portion which extends from the other end of the first portion to overlap with the other bit line which constitutes the corresponding unit memory cell.

23. The semiconductor integrated circuit device according to claim 22, wherein a pair of gate electrodes, which are positioned on each shared gate contact part, are symmetrical to each other with respect to a corresponding word line.

24. A semiconductor integrated circuit device comprising:
a semiconductor substrate including active regions;
word lines arranged on the semiconductor substrate;
bit lines arranged to cross with the word lines such that unit memory cells are each delimited by a pair of adjacent word lines and a pair of adjacent bit lines;
gate electrodes contacting predetermined portions of the word lines and bent to overlap with the bit lines; and
bit line contacts electrically connecting the bit lines and the active regions,
wherein gate electrodes of unit memory cells, which adjoin each other with a word line interposed therebetween, are commonly connected with the corresponding word line, and
wherein the bit line contacts are arranged on portions of the bit lines between an adjacent pair of the word lines.

* * * * *